(12) United States Patent
Ogashiwa et al.

(10) Patent No.: US 10,125,015 B2
(45) Date of Patent: Nov. 13, 2018

(54) PACKAGE PRODUCTION METHOD AND PACKAGE PRODUCED BY THE METHOD

(71) Applicant: TANAKA KIKINZOKU KOGYO K.K., Chiyoda-ku, Tokyo (JP)

(72) Inventors: Toshinori Ogashiwa, Hiratsuka (JP); Yuya Sasaki, Hiratsuka (JP); Masayuki Miyairi, Hiratsuka (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 0 days.

(21) Appl. No.: 15/556,161

(22) PCT Filed: Aug. 18, 2015

(86) PCT No.: PCT/JP2015/073101
§ 371 (c)(1),
(2) Date: Sep. 6, 2017

(87) PCT Pub. No.: WO2016/157562
PCT Pub. Date: Oct. 6, 2016

(65) Prior Publication Data
US 2018/0044175 A1   Feb. 15, 2018

(30) Foreign Application Priority Data
Apr. 3, 2015   (JP) .................................. 2015-077160

(51) Int. Cl.
*H01L 21/44*   (2006.01)
*H01L 21/48*   (2006.01)
(Continued)

(52) U.S. Cl.
CPC ............ *B81C 1/00269* (2013.01); *B81C 3/00* (2013.01); *H01L 23/02* (2013.01);
(Continued)

(58) Field of Classification Search
None
See application file for complete search history.

(56) References Cited

U.S. PATENT DOCUMENTS

2006/0115323 A1* 6/2006 Coppeta ............... A61K 9/0097
403/270
2016/0311677 A1* 10/2016 Ogashiwa ........... B81C 1/00269

FOREIGN PATENT DOCUMENTS

JP   2000-294664 A   10/2000
JP   2008-28364 A    2/2008
(Continued)

OTHER PUBLICATIONS

International Search Report for PCT/JP2015/073101, dated Oct. 27, 2015.

*Primary Examiner* — Thien F Tran
(74) *Attorney, Agent, or Firm* — Orrick, Herrington & Sutcliffe LLP; Joseph A. Calvaruso (57) ABSTRACT

The present invention relates to a package production method includes the step of superposing a pair of substrates on each other, and bonding the substrates to each other to hermetically seal the inside of a sealing region surrounded by a sealing material, which is formed on any of the substrates. The sealing material is formed of a sintered body obtained by sintering a metal powder of at least one selected from gold, silver, palladium and platinum, the metal powder having a purity of 99.9% by weight or more and an average particle size of 0.005 μm to 1.0 μm, at least one core material having a width smaller than the width of the sealing material in a cross-sectional shape, and protruding from the periphery is formed on the substrate, and the core material compresses the sealing material to exhibit a sealing effect when the pair of substrates are bonded to each other. Accordingly, a (Continued)

sufficient sealing effect can be exhibited while a pressuring force to the substrate is reduced.

17 Claims, 5 Drawing Sheets

(51) Int. Cl.
  *H01L 21/50*    (2006.01)
  *B81C 1/00*     (2006.01)
  *B81C 3/00*     (2006.01)
  *H01L 23/02*    (2006.01)

(52) U.S. Cl.
  CPC . *B81C 2203/019* (2013.01); *B81C 2203/0118* (2013.01); *B81C 2203/036* (2013.01)

(56) References Cited

FOREIGN PATENT DOCUMENTS

| | | |
|---|---|---|
| JP | 2009-117869 A | 5/2009 |
| JP | 2009-278562 A | 11/2009 |
| JP | 5065718 B | 8/2012 |
| JP | 2013-8720 A | 1/2013 |

\* cited by examiner

PACKAGE PRODUCTION METHOD AND PACKAGE PRODUCED BY THE METHOD

TECHNICAL FIELD

The present invention relates to a method for producing a hermetic sealing package for various kinds of devices such as electronic devices, and particularly to a method useful in production of a wafer-level package with a plurality of sealing regions formed on a substrate.

BACKGROUND ART

Various kinds of functional devices to be used in electronic devices such as MEMS elements are delicate components having a sensing section and a driving section, and are often packaged while being hermetically sealed for preventing deterioration of functions due to deposition of particles etc. These hermetic sealing packages are produced in the following manner: one substrate on which a semiconductor element is mounted, and the other substrate (sometimes also referred to as a cap, a cover and the like) are bonded to each other with a sealing material interposed between both the substrates, and are hermetically sealed.

Here, as a sealing material to be used in production of a package, a brazing material (e.g. Au—Sn-based brazing material etc.) has been widely used heretofore. However, with a brazing material, the bonding temperature (the melting temperature of a brazing material) is high, and a sealing material with which bonding can be performed at a lower temperature has been desired. Against such a background, the present inventors have developed a sealing method using a metal paste containing a predetermined metal powder as a method which enables low-temperature bonding and improves sealing property (Patent Document 1).

In the sealing method using a metal paste as developed by the present inventors, a metal paste is applied to at least one substrate, and sintered to obtain a metal powder sintered body, and the metal powder sintered body is used as a sealing material. A pair of substrates are pressurized to be bonded to each other with the metal powder sintered body as a sealing material being interposed between the substrates. Here, the sealing material is pressurized to be densified to the extent that the sealing material is almost as dense as a bulk body.

RELATED ART DOCUMENT

Patent Documents

Patent Document 1: JP 5065718 B2

SUMMARY OF THE INVENTION

Problems to be Solved by the Invention

With improvement of performance of electronic devices in recent years, various kinds of devices have been required to be further downsized and thinned, and as a method for mounting elements, wafer-level packaging has increasingly replaced an existing method in which chips cut out individually from a wafer are packaged as substrates. The wafer-level packaging is a process in which operations ranging from mounting of a sealing material to assembly of a device are completed on a wafer without separating the wafer into chips before sealing.

The sealing method using a metal paste developed by the present inventors is basically applicable to wafer-level packaging. With advancement of paste coating techniques, a sealing material including a metal powder sintered body can be formed on a wafer by applying a metal paste onto the wafer in a fine pattern.

In a sealing step in wafer-level packaging using a sealing material including a metal powder sintered body as described above, there arises a concern about securing a balance between the pressing load and the quality of a sealing material after sealing. As described above, pressurization is an essential step in sealing with a metal powder sintered body. When the pressurization is insufficient, voids (air gaps) remain in the sealing material. Voids do not have so much influences singly, but linkage of a plurality of voids cause a leak path. Thus, in package sealing using a sealing material including a metal powder sintered body, control of a pressurizing force is important.

This does not mean that the pressurizing force only have to be merely increased. When a plurality of sealing regions exist on a substrate as in wafer-level packaging, the bonding area (sealing area) of the sealing material (metal powder sintered body) increases in proportion to the number of packages. Since a pressing load required for the whole substrate is determined by multiplying a pressurizing force and a bonding area, an increase in pressurizing force required for densification of individual sealing materials leads to an increase in pressing load for the whole substrate. When the pressing load is excessively large, a load on a wafer bonding device increases, and sometimes exceeds the specification of the bonding device. Thus, the demand for reducing the pressing load for the whole substrate is incompatible with the demand for securing a pressurizing force for suppressing defects of the sealing material, and it is not necessarily easy to highly balance both the demands. In production of a package using a metal powder sintered body as a sealing material, it is necessary to ensure that hermetic sealing is efficiently and reliably performed with a low pressurizing force.

The present invention has been made iagainst the background described above, and provides a method for exhibiting a sufficient sealing effect while reducing a pressurizing force in a method for producing a sealing package using as a sealing material a metal powder sintered body formed from a predetermined metal paste.

Means for Solving the Problems

For solving the problems described above, the present inventors conducted studies with reexamination of a mechanism of densification in a metal powder sintered body in the first place. A sealing material including a metal powder sintered body developed by the present inventors is further densified when pressurized even after being solidified as a sintered body. This takes advantage of properties based on the purity and particle size of a metal powder to be applied. The densification under pressurization is caused by the action of any of physical changes such as plastic deformation/binding of a metal powder that forms the metal powder sintered body, and a metallographical change due to recrystallization by thermal energy applied by pressurization and heating, or the superposed action of these changes.

Figure 1:
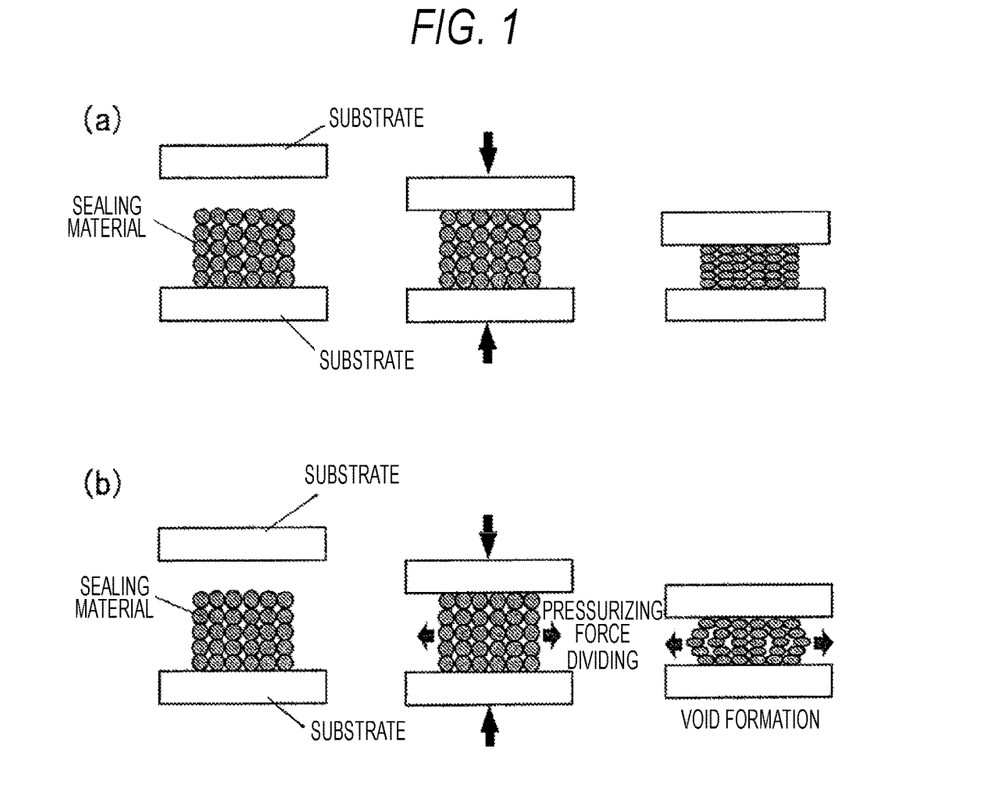
FIGS. 1(a) and 1(b) are views illustrating a process of pressurizing a sealing material with a conventional metal powder sintered body used as the sealing material.

Of course, plastic deformation/binding of the metal powder sintered body assumes a state in which a pressure is unidirectionally (vertically) applied, and in this case, densification occurs without a gap due to advancement of orderly deformation/binding (FIG. 1(a)). Actually, however, the side surface of a sealing material including an assembly of metal particles is an unconfined free surface, and therefore the pressurizing force is divided in lateral directions (FIG. 1(b)). Since the divided pressurizing force generates gaps between metal particles, and these gaps may remain as voids, excessive pressurization is necessary for preventing formation of voids.

The present inventors supposed a mechanism of densification of a sealing material including a metal powder sintered body as described above, and thought that for avoiding voids from remaining in the sealing material while reducing a pressurizing force, avoidance of division of the pressurizing force in lateral directions is a suitable measure. The present inventors found that as specific means for the measure, it is effective that a projection having a width smaller than that of the sealing material is provided on a substrate, and the sealing material is selectively and preferentially pressurized and compressed with the projection.

The present invention provides a package production method, which includes the step of superposing a pair of substrates on each other, and bonding the substrates to each other to hermetically seal the inside of a sealing region surrounded by a sealing material, the sealing material being formed on at least one of the substrates, wherein the sealing material is formed of a sintered body obtained by sintering a metal powder of at least one selected from gold, silver, palladium and platinum, and has a purity of 99.9% by weight or more and an average particle size of 0.005 μm to 1.0 μm, at least one core material having a width smaller than the width of the sealing material in a cross-sectional shape, and protruding from the periphery is formed on the substrate, and the core material compresses the sealing material when the pair of substrates are bonded to each other.

Figure 2:
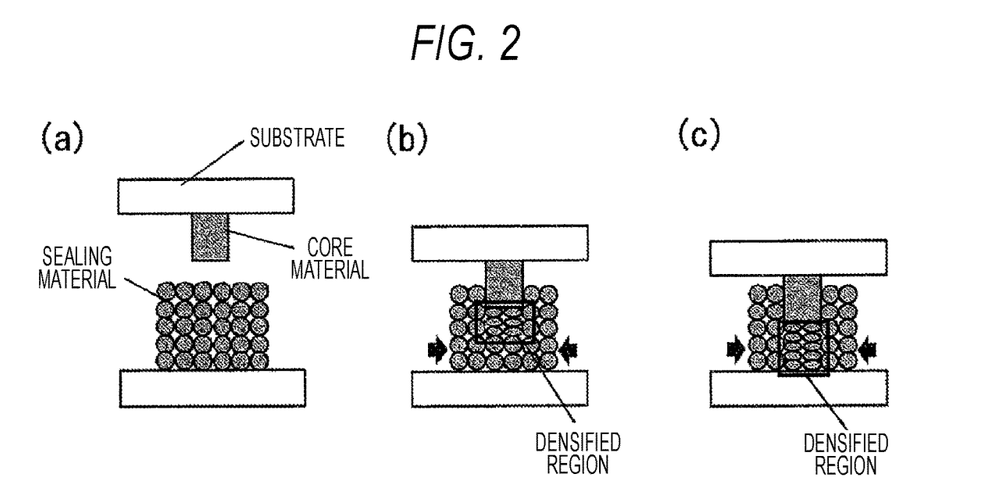
FIGS. 2(a) to 2(c) are views illustrating a process of pressurizing a sealing material in a sealing step using a core material in the present invention.

In a method for sealing a package according to the present invention, a protruding projection (core material) having a width smaller than that of the sealing material is provided on a substrate (FIG. 2(a)). When the substrate provided with the core material is superposed on the other substrate with the sealing material interposed between both the substrates, and sealing is performed, a contact surface between the core material and the sealing material is preferentially pressurized. A metal powder coming into contact with the core material is confined by a metal powder on the periphery, and thus compressed by an almost unidirectional pressurizing force. The selectively pressurized metal powder starts deforming in the first place, and a region densified by the action of one or both of the above-mentioned plastic deformation and recrystallization is formed. In the present application, a region densified as described above is referred to as a densified region (FIG. 2(b)). The densified region is expanded by continuously applying pressure to the substrate, so that a columnar densified region corresponding to the position of the core material is formed (FIG. 2(c)). The columnar densified region has a structure which is partially or fully recrystallized, or which is not recrystallized, but has no continuous voids (air gaps) and is sufficiently densified, and therefore the sealing region surrounded by the densified region has high airtightness.

In formation of a columnar densified region as described above, an upper substrate and a sealing material are in partial contact with each other, and therefore sealing can be performed with a lower load compared with a conventional method in which the whole surface of a sealing material should be pressurized to bring the entire sealing material into a densified region. Thus, according to the present invention, a region surrounded by a sealing material can be sealed while a load on a substrate during sealing is reduced.

Hereinafter, the method according to the present invention will be described in detail. First, the substrate in the present invention is a member having a surface on which at least one sealing region should be formed, and the substrate may be a silicon wafer, a metal wafer, or a resin substrate. Various kinds of functional devices etc. may be mounted beforehand in the sealing region of the substrate. In the present invention, the substrate on which the sealing region is formed is expressed as a pair of substrates, and these substrates are not required to have the same size.

In the present invention, a sealing material including a metal powder sintered body is formed on at least one of the substrates, and the substrates are bonded to each other to form a sealing region. The sealing material in the present invention is a sintered body of a metal powder. The method for forming the sealing material will be described in detail later. The sealing material is obtained by sintering a metal powder composed of at least one metal selected from gold, silver, palladium and platinum, the metal powder having a purity of 99.9% by weight or more and an average particle size of 0.005 μm to 1.0 μm. The reason why a metal having a high purity is required as a condition of a metal powder for forming a sintered body is that when the purity is low, the hardness of the powder increases, so that the resulting sintered body will be hardly deformed or recrystallized, and may fail to exhibit a sealing action. As described later, a metal paste including a metal powder and a solvent is used for formation of the sintered body, and the metal paste does not contain a glass frit. Thus, the formed sealing material includes a high-purity metal as in the powder. Specifically, the sealing material is composed of a metal having a purity of 99.9% by weight or more.

The density of the sealing material has an influence on whether a densified region can be formed or not during compression of the sealing material. When the density of the sintered body that forms the sealing material is low, plastic deformation/binding of the metal powder hardly progresses even when the sealing material is compressed, and thus a densified region is not formed, or a width sufficient for attaining a sealing effect cannot be attained. The relative density of the sintered body that forms the sealing material is preferably 60% or more with respect to a bulk body of constituent metal particles (bulk material produced in the same composition by casting, plating or the like). Particularly, the relative density of the sintered body is preferably 70% or more, and by using a sintered body having a density close to that of the bulk body, a densified region having a size close to the width of the core material can be obtained.

The shape of the sealing material is not particularly limited. Examples of the cross-sectional shape of the sealing material include a rectangular shape and a trapezoidal shape. When the core material is mounted on a substrate which is provided with the sealing material, the sealing material is required to cover the top surface of the core material, and in this case, the shape of the sealing material is not limited as long as the requirement is satisfied.

The present invention uses the core material being a projection for selectively and preferentially pressurizing and compressing the sealing material including a metal powder sintered body. Here, a plurality of arrangement patterns of the core material and the sealing material can be conceived. Specifically, when the sealing material is formed on any one of the substrates, the core material may be mounted on the other substrate having no sealing material (FIG. 3(a)), or the core material may be mounted on the substrate which is provided with the sealing material (FIG. 3(b)). The sealing material can also be formed on both the substrates, and the core material can be formed on at least one of the substrates which are provided with the sealing material (FIGS. 3(c) and 3(d)).

Figure 3:
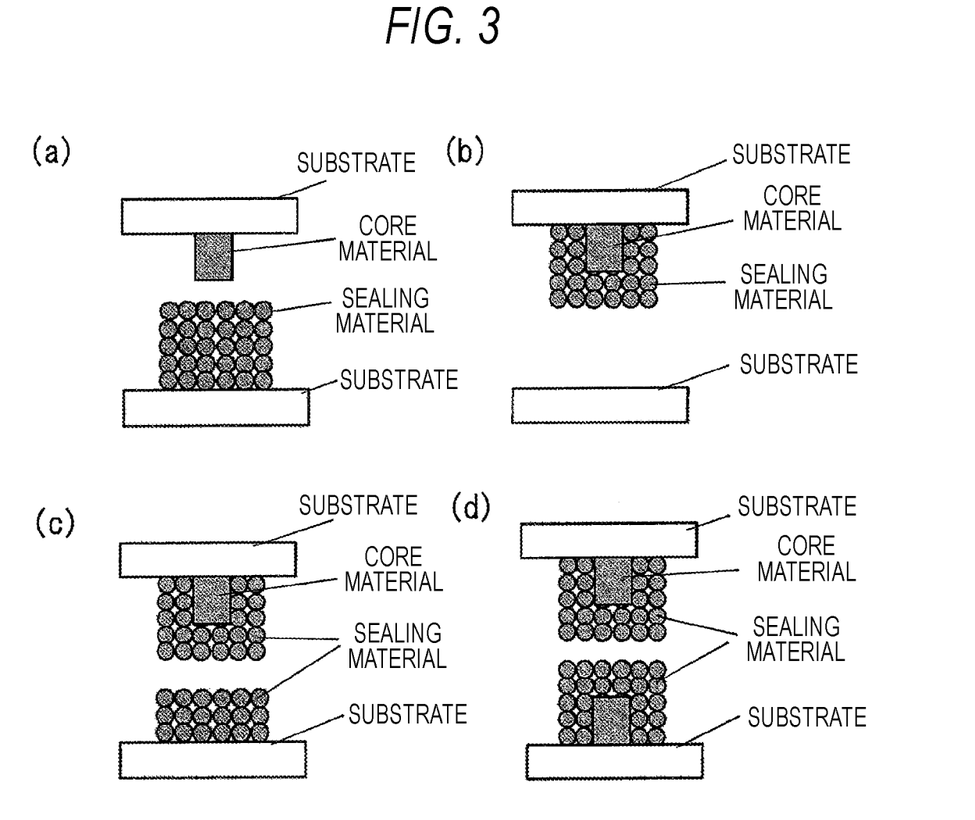

When the core material is mounted on a substrate which is provided with the sealing material (FIGS. 3(b) to 3(d)), at least the top surface portion of the core material is required to be covered with the sealing material. In the present invention, the core material pressurizes the sealing material to attain densification, and therefore there is no effect unless the sealing material exists on the top surface of the core material. The sealing material should cover at least the top surface of the core material, and may fully or partially cover the core material.

Figure 4:
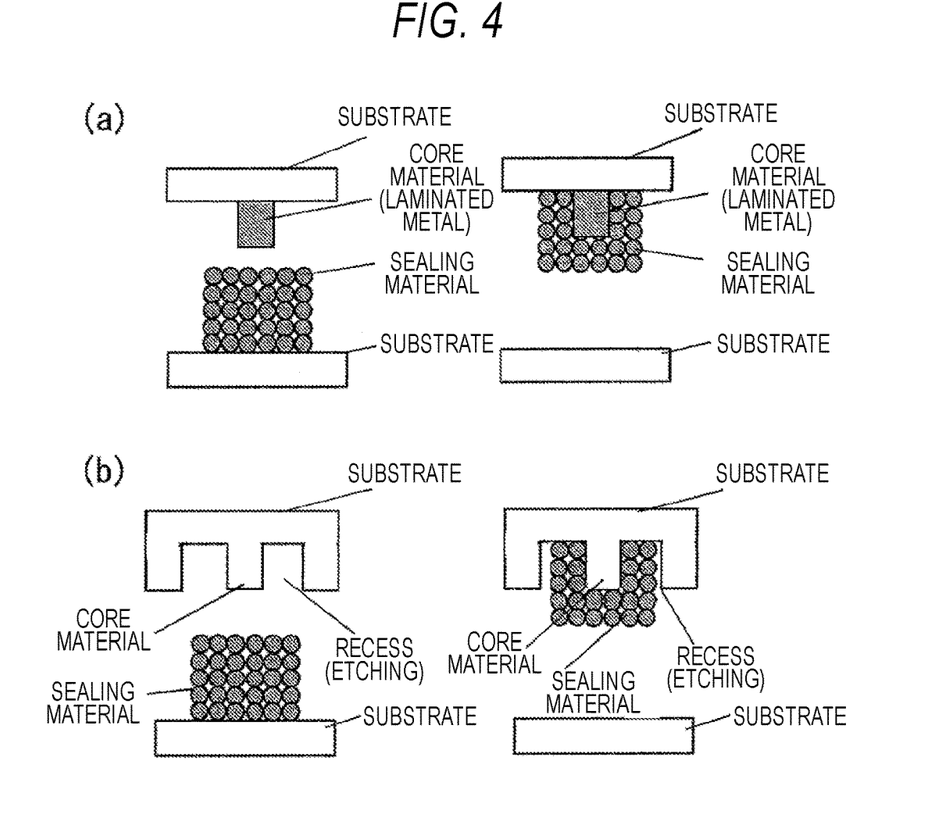

As a form of the core material, a convex metal is deposited on a substrate (FIG. 4(a)). For example, a metal layer or nonmetal layer formed by a plating method (electroplating or electroless plating), a sputtering method, a CVD method or the like may be used. The core material can also be formed by processing the substrate. For example, by locally thinning the substrate by etching etc. to form recesses in regions adjacent to the core material on both sides, a cross-sectionally convex core material can be formed (FIG. 4(b)). Here, the top surface of the core material may be flush with the substrate surface, or there may be a level difference between the former and the latter.

The core material is required to be a bulk body. Accordingly, the pressurizing force is effectively propagated to densify the sealing material. The constituent material of the core material may be identical to the material of the substrate or the metal material that forms the sealing material, or may be different from either of the material of the substrate and the metal material. The core material may have a multi-layered structure. When the substrate is etched to form a core material as described above, the materials of the core material and the substrate are identical to each other. When a metal is deposited by a plating method etc. to form a core material, core materials of various materials can be formed. The material of the core material that is formed by a plating method etc. is preferably an electrically conductive metal such as copper, nickel, gold, platinum or silver.

Figure 5:
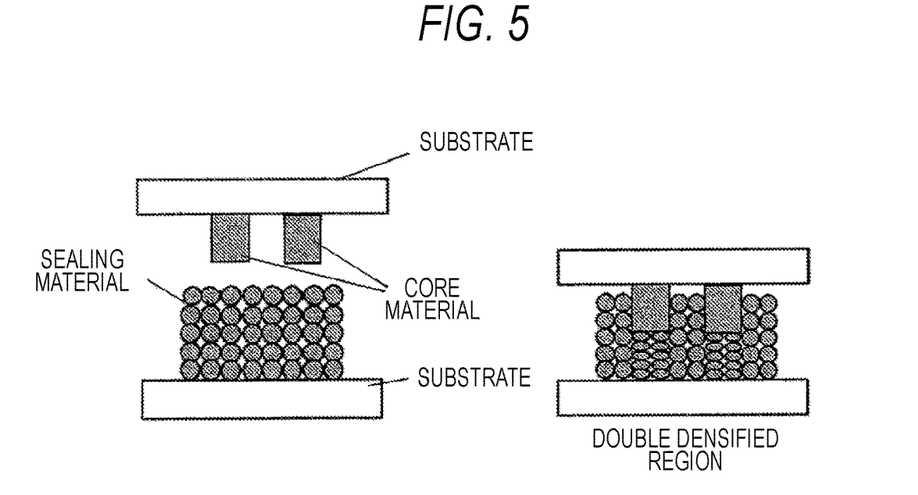
FIG. 5 illustrates views illustrating a mounting mode of a core material (formation of a plurality of core materials) in the present invention.

The shape of the core material is not particularly limited as long as the core material protrudes from the periphery thereof. Examples of the cross-sectional shape of the core material include a triangular shape, a rectangular shape and a trapezoidal shape. The core material is intended to pressurize the sealing material, and is therefore formed in conformity with the formation pattern of the sealing material. For example, when the sealing material is formed in a ring shape (round shape or rectangular shape), and the region of the sealing material is sealed, the core material is formed by a ring-shaped pattern analogous to the pattern of the sealing material. Here, at least one core material is required, but a plurality of core materials may be formed within the range of width of the sealing material (FIG. 5).

Figure 6:
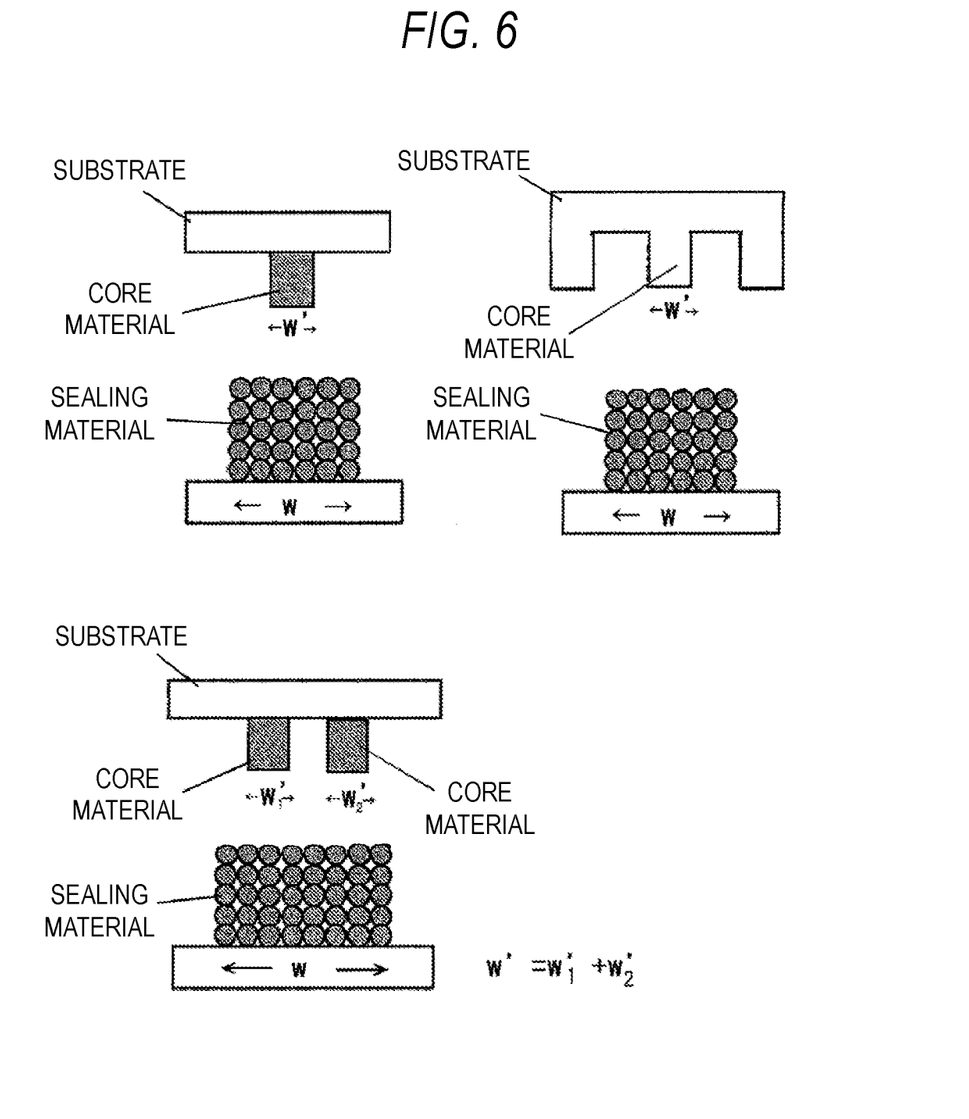
FIG. 6 illustrates views illustrating a relationship between a width (W') of a core material and a width (W) of a sealing material in the present invention.

The width (W') of the core material is preferably not less than 0.05 and not more than 0.95 in terms of a ratio (W'/W) to the width (W) of the sealing material. When the ratio (W'/W) is less than 0.05, the width of the sealing material that is densified is too small to assure a hermetic sealing effect. When the ratio (W'/W) is more than 0.95, compression of the sealing material without dividing the pressurizing force is difficult. The ratio (W'/W) is preferably not less than 0.1 and not more than 0.8. The width of the core material refers to the width of the top surface, and when a plurality of core materials are formed, the width of the core material refers to the total of the widths of the sealing materials. The width of the sealing material refers to the width of a contact surface with the substrate, which is the bottom surface of the sealing material (FIG. 6).

Here, in the present invention, preferably, a bulk-like metal film of at least one selected from gold, silver, palladium, platinum, titanium, chromium, copper, tungsten, nickel and an alloy of these metals is formed on surfaces of the substrate and the core material. Examinations by the present inventors show that densification of a metal powder that forms a sealing material is advanced by pressurization from a core material as a bulk body, but the densification is difficult near the bonding interface with the bulk body. Thus, a bulk-like metal film is formed on the substrate, and a sealing material is formed on the metal film, so that adhesion between the substrate and the sealing material can be improved to promote densification. The metal film that may also be called an underlying film should be provided on both the substrates. Accordingly, the sealing material is pressurized between two bulk bodies: the metal film of the core material and the metal film of the substrate, and therefore favorable densification is performed at both the bonding interface between the core material and the sealing material and the interface between the sealing material and the substrate. When a core material is formed on one substrate, and a sealing material is formed on the other substrate, densification can be attained at the two interfaces by forming a metal film on the other substrate as an underlying layer of the sealing material. The metal film may be formed on both the substrates. Further, the metal film may be formed on a surface of the core material. Formation of the metal film on the core material is useful depending on the material of the core material.

The material of the metal film is gold, silver, palladium, platinum, titanium, chromium, copper, tungsten, nickel, or an alloy of these metals with consideration given to adhesion with the sealing material, electrical conductivity, and so on. The metal film is preferably one formed by a plating method, a sputtering method, a vapor deposition method, a CVD method or the like. The metal film may have a single-layer structure or a multi-layered structure, but the metal of a layer that is in contact with the sealing material is preferably a metal identical in material to the metal of the metal powder. The thickness of the metal film is preferably not less than 0.01 μm and not more than 5 μm.

A step of producing a core material and a sealing material on a substrate, and a step of sealing a package by the substrate provided with the core material and the sealing material in a package production method according to the present invention will now be described in detail.

The method for forming a core material depends on the form of the core material as described above, and a core material with a metal convexly deposited on a flat surface of the substrate can be formed by a plating method, a sputtering method, a CVD method or the like. The core material can also be formed by processing the substrate, and a rim-like core material can be formed by etching the substrate.

A method for forming a sealing material will be described. A metal paste to be used includes an organic solvent, and a metal powder of at least one selected from gold, silver, palladium and platinum, the metal powder having a purity of 99.9% by weight or more and an average particle size of 0.005 μm to 1.0 μm. The purity of the metal powder is set to 99.9% or more with consideration given to securing of electrical conductivity in addition to deformability and recrystallization of the resulting sintered body as described above. The reason why the average particle size of the metal powder is set to 0.005 μm to 1.0 μm is that in the case of a metal powder having a particle size of more than 1.0 μm, gaps are easily filled when a sealing material having a very small width is provided, and in the case of a metal powder having a particle size of less than 0.005 μm, the powder is easily aggregated in the metal paste, leading to deterioration of the handling property.

As the organic solvent to be used in the metal paste, ester alcohol, terpineol, pine oil, butylcarbitol acetate, butylcarbitol, carbitol, isobornyl cyclohexanol (e.g. TERSOLVE MTPH as a product name: manufactured by Nippon Terpene Chemicals, Inc.), 2,4-diethyl-1,5-pentanediol (e.g. NIKO MARS as a product name: manufactured by The Nippon Koryo Yakuhin Kaisha, Ltd.), and dihydro-terpineol (e.g. NIKO MHD as a product name: manufactured by The Nippon Koryo Yakuhin Kaisha, Ltd.) are preferred.

Preferably, the metal powder and the organic solvent in the metal paste to be applied are blended at a blending ratio of 80 to 99% by weight for the metal powder and 1 to 20% by weight for the organic solvent. The blending ratio of the metal powder and the organic solvent is set as described above for ensuring that aggregation of the metal powder can be prevented to supply a sufficient amount of the metal powder for forming a sealing material.

The metal paste may contain additives. The additives include at least one selected from an acryl-based resin, a cellulose-based resin and an alkyd resin. Examples of the acryl-based resin may include methyl methacrylate polymers, examples of the cellulose-based resin may include ethyl cellulose, and examples of the alkyd resin may include phthalic anhydride resins. These additives serve to suppress aggregation of the metal powder in the metal paste, so that the metal paste is made homogeneous. The added amount of the additive is preferably 2% by weight or less in terms of a ratio to the metal paste. Accordingly, the metal powder content can be made to fall within a range adequate for filling a through-hole while a stable aggregation suppressing effect is maintained.

Unlike general metal pastes that are widely used for formation of electrode and wiring patterns, etc., the metal paste in the present invention does not contain a glass frit. In the present invention, a glass frit is not mixed with the metal paste, and this is intended to form a fine and dense frame-like sealing material, and to prevent remaining of impurities that hinder densification. Components other than the metal powder which form the metal paste, such as the organic solvent, are eliminated in drying and sintering steps after filling of the powder, and therefore do not exist as hindrance factors like a glass frit.

The method for applying the metal paste to the substrate in a sealing material forming step is not particularly limited. Preferably, the metal paste is dried after being applied. The drying temperature is preferably 150 to 250° C. or lower. The heating temperature at which the metal paste is sintered is preferably 150 to 300° C. When the heating temperature is lower than 150° C., the metal powder cannot be sufficiently sintered, and when the heating temperature is higher than 300° C., sintering excessively progresses, so that the metal powder is excessively hardened due to progress of necking between metal powders. As an atmosphere during firing, air, an inert gas (nitrogen, argon or helium), an inert gas containing 1 to 5% of hydrogen, or the like is selected. The firing time is preferably 30 minutes to 8 hours. When the firing time is excessively long, there arises the problem that sintering excessively progresses, so that the metal powder is excessively hardened due to progress of necking between metal powders.

Through the application and sintering of the metal paste, the metal powder is sintered and solidified to form a sealing material including a metal powder sintered body.

In the sealing method using a substrate on which a core material and a sealing material are formed in the manner described above, a pair of substrates are superposed on each other with the sealing material interposed between the substrates, and are heated and simultaneously pressurized to densify the sealing material.

In heating and pressurization conditions here, the heating temperature is preferably 80 to 300° C. This is intended to progress densification of the metal powder while suppressing damage to the substrate and elements on the substrate. The heating temperature is preferably 150 to 250° C.

The heating and pressurization treatment time is preferably 0.5 to 3 hours after the temperature reaches a set heating temperature. By the heating and pressurization treatment, the sealing material is densified with the crest part collapsed and the metal powder plastically deformed and recrystallized preferentially at a part of the base in the vicinity of an area immediately below the crest part. In the resulting densified region, the upper substrate and the sealing material are in partial contact with each other, and therefore hermetic sealing is established with a lower load compared with a conventional method in which the whole surface of a sealing material is pressed to densify the whole of the sealing material.

The package produced through the above steps is a package in which a pair of substrates are bonded with a metal powder sintered body as a sealing material being interposed between the substrates, and the sealing material has a configuration in which in the metal powder sintered body, a cross-sectionally columnar densified region exists so as to correspond to the core material and the position of the core material. The cross-sectionally columnar densified region secures airtightness of the region surrounded by the sealing material. As described above, the densified region is a metal phase having a structure which is partially or fully recrystallized, or which is not recrystallized, but has a structure which has no continuous voids (air gaps) and is sufficiently densified. The densified region has a density of not less than 98% and not more than 100% with respect to a bulk-like metal of the same composition.

Advantageous Effects of the Invention

As described above, a hermetic sealing package member according to the present invention attains reliable hermetic sealing while a pressing load is reduced even for a substrate with a large number of sealing regions provided on the substrate. A hermetic sealing method according to the present invention is capable of hermetically sealing a plurality of regions in a relatively simple step using a predetermined metal paste, and is expected to be applied to wafer-level packaging.

BRIEF DESCRIPTION OF THE DRAWINGS

FIGS. 3(a) to 4(d) are views illustrating a mounting mode of a core material and a sealing material in the present invention.

FIGS. 4(a) and 4(b) are views illustrating a mounting mode of a core material (rim-like core material obtained substrate etching) in the present invention.

DESCRIPTION OF EMBODIMENT

Hereinafter, a preferred embodiment of the present invention will be described. In this embodiment, a predetermined metal paste was provided, core materials and sealing materials in various kinds of forms were formed, sealing work was actually performed, and the effect of the sealing was examined. Materials of sealing materials and so on for use in this embodiment, and methods for forming the core materials and sealing materials will now be described.

In this embodiment, a silicon wafer (thickness: 0.5 μm, mirror-polished on both sides) having a diameter of 4 inches was provided as a substrate. Two core materials were formed: (1) a rim-like core material was formed by a general photolithography step and etching; and (2) a core material including a metal layer was formed by an electroplating liquid treatment. The formation pattern of the core material was set in such a manner that the core material was in contact with substantially the center of the sealing material, the formation pattern of which will described later. Each core material was formed in the following manner.

(1) Formation of Rim-Like Core Material by Etching

A resist film was formed on a silicon surface by a spin coating method, and photolithography processing was performed in such a manner that the resist film was left on a portion that would form a core material. Next, a portion having no resist film was dug down by 10 μm using a silicon dry etching apparatus (trade name: PEGASUS manufactured by Sumitomo Precision Products Co., Ltd.). Thereafter, the resist film left on the upper part of the core material was removed to form a core material. Finally, on the whole surface of the wafer, Ti (0.05 μm)/Pt (0.01 μm)/Au (0.2 μm) (with Ti on the substrate side) was deposited by a sputtering method to form a multi-layered metal film.

(2) Formation of Metal Layer-Like Core Material by Electroplating

First, Ti (0.05 μm)/Pt (0.01 μm)/Au (0.2 μm) was formed on the whole surface of a wafer by a sputtering method. Next, a resist film was formed by a spin coating method, and photolithography processing was performed in such a manner that a portion that would form a core material was opened. Finally, copper (7 μm) and nickel (2 μm), and gold (0.5 μm) were deposited in this order to form a core material and a metal film, and the resist film was then removed.

As a metal paste as a raw material for a metal powder sintered body to be a sealing material, a metal paste adjusted by 96% by weight of a metal powder produced by a wet reduction method, and 4% by weight of isobornyl cyclohexanol (MTPH) as an organic solvent was used. In this embodiment, metal pastes of metal powders of gold, silver, palladium and platinum were provided.

Thereafter, the metal pastes were applied to the substrate. In this embodiment, 10 rectangular sealing regions each having a sealing material width of 300 μm and a pattern shape of 10 mm square were provided on the substrate. The metal paste was applied via a metal mask following the pattern of the sealing material. In the application of the metal paste, the mask was placed on the wafer, and the metal paste was applied from above the mask by printing. After the paste was applied, drying was performed at 150° C. to remove a solvent and a gas component in the metal paste. Thereafter, the metal paste was fired in an argon-4% hydrogen atmosphere at 200° C. for 2 hours to remove the solvent and the gas component in the metal paste.

Figure 7:
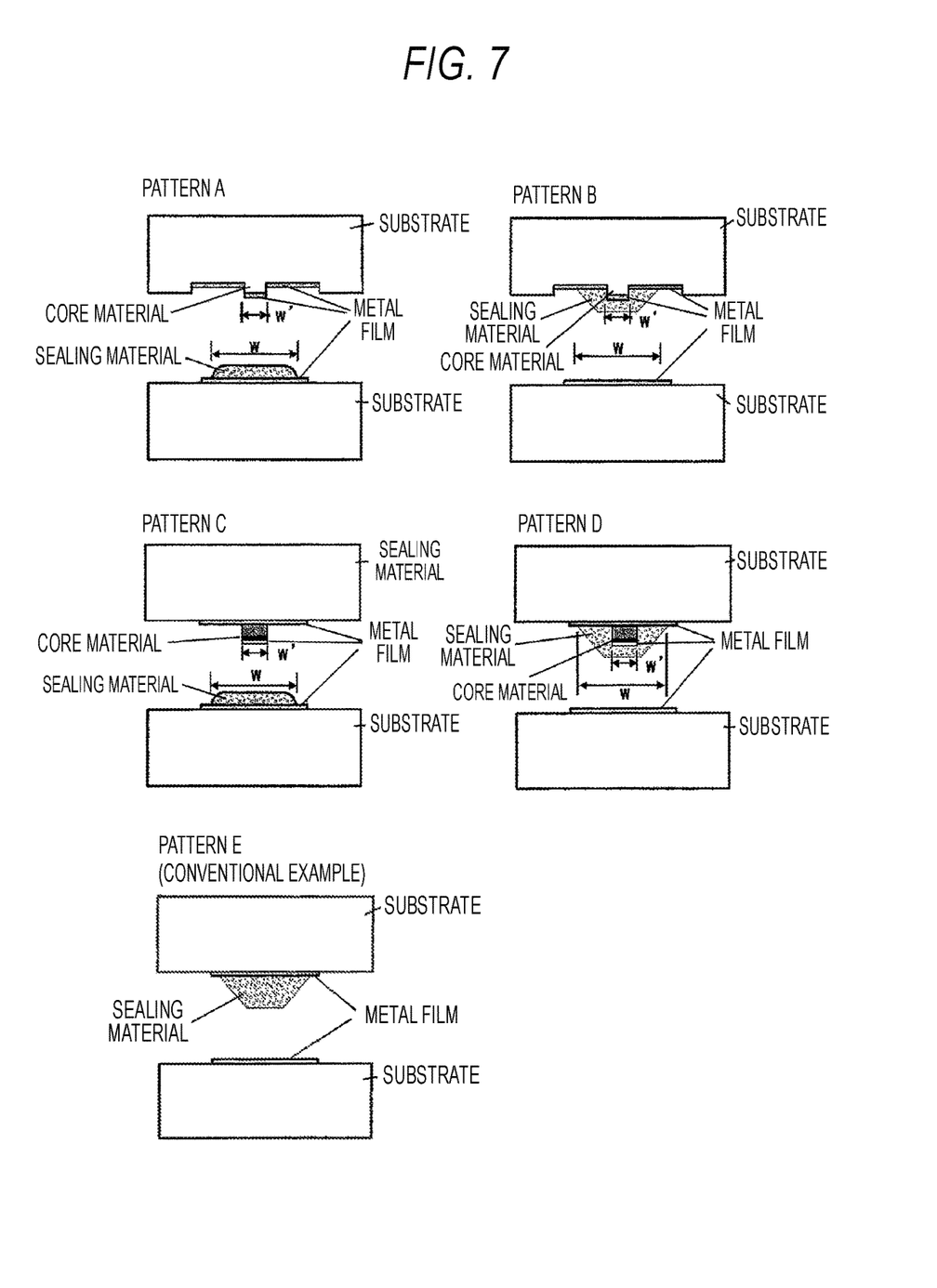
FIG. 7 illustrates views illustrating modes of substrates having cores and sealing materials in various patterns, which are produced in an embodiment.

In this embodiment, combinations were made with the above-mentioned steps as a basis to form a core material and a sealing material on a substrate in a plurality of forms as shown in FIG. 7. In pattern A and pattern B in FIG. 7, a rim-like core material is formed by an etching method. In pattern C and pattern D, a metal layer-like core material is formed by an electroplating method. In pattern A and pattern C, a metal paste is applied onto a substrate which is not provided with a core material. In pattern B and pattern D, a metal paste is applied onto a core material.

A sealing test was conducted for the substrate in each form. In the sealing test, one wafer is set on a heater, and on this wafer, the other wafer was placed in a vacuum atmosphere. A load was applied from above, and the wafers were then heated by the heater. Two pressing loads: 100 MPa and 150 MPa were set. As a heating condition, the wafers were heated at a temperature elevation rate of 30° C./min to 200° C., and held for 30 minutes after the temperature reached 200° C.

After the pressing, the load was removed, and a helium leak test (bell jar method) was conducted for examining airtightness of a sealing region on the inside of the sealing material. In this evaluation, samples having a helium leak rate of $10^{-9}$ Pa·m$^3$/s were rated acceptable. For comparison, a package using a conventional substrate having no core material was also produced, and airtightness of the package was examined. In this conventional example, a pattern was formed with the same plane shape as in this embodiment (sealing material width: 300 μm, pattern shape: 10 mm square) and a size of 10 μm in terms of a height by metal mask printing by use of the same metal paste as in this embodiment, and the metal paste was then dried and fired to form a rectangular frame-like sealing material. Thereafter, the wafers were bonded to each other under the same conditions as in this embodiment to perform hermetic sealing. The results are shown in Table 1.

TABLE 1

| | | Sealing material | | | | Results of sealing test | |
| | | Metal | Particle | Core material | | Pressurizing | Leak rate | |
| No. | Pattern*1 | powder | size | Width | w'/w | force*2 | (Pa · m$^3$/s) | Assessment |
|---|---|---|---|---|---|---|---|---|
| 1 | A | Au | 0.3 μm | 10 μm | 0.1 | 150 MPa | $10^{-11}$ to $10^{-12}$ | Passed |
| 2 | B | | | | | 150 MPa | $10^{-11}$ to $10^{-12}$ | Passed |

TABLE 1-continued

| | | Sealing material | | | | | Results of sealing test | |
|---|---|---|---|---|---|---|---|---|
| | | Metal | Particle | Core material | | Pressurizing | Leak rate | |
| No. | Pattern*1 | powder | size | Width | w'/w | force*2 | (Pa · m³/s) | Assessment |
| 3 | C | | | | | 150 MPa | $10^{-11}$ to $10^{-12}$ | Passed |
| 4 | D | | | | | 150 MPa | $10^{-11}$ to $10^{-12}$ | Passed |
| 5 | B | | | | | 100 MPa | $10^{-11}$ to $10^{-12}$ | Passed |
| 6 | A | | | 50 μm | 0.5 | 150 MPa | $10^{-10}$ to $10^{-11}$ | Passed |
| 7 | A | | 1.2 μm | 10 μm | 0.1 | 150 MPa | $10^{-7}$ to $10^{-8}$ | failed |
| 8 | A | Ag | 0.3 μm | 10 μm | 0.1 | 150 MPa | $10^{-11}$ to $10^{-12}$ | Passed |
| 9 | B | | | | | 150 MPa | $10^{-11}$ to $10^{-12}$ | Passed |
| 10 | D | | | | | 150 MPa | $10^{-11}$ to $10^{-12}$ | Passed |
| 11 | B | Pd | 0.3 μm | 10 μm | 0.1 | 150 MPa | $10^{-11}$ to $10^{-12}$ | Passed |
| 12 | D | | | | | 150 MPa | $10^{-11}$ to $10^{-12}$ | Passed |
| 13 | B | Pt | 0.3 μm | 10 μm | 0.1 | 150 MPa | $10^{-11}$ to $10^{-12}$ | Passed |
| 14 | D | | 0.3 μm | | | 150 MPa | $10^{-11}$ to $10^{-12}$ | Passed |
| 15 | E*3 | Au | 0.3 μm | — | — | 150 MPa | $10^{-7}$ to $10^{-8}$ | Failed |
| 16 | | | | — | — | 200 MPa | $10^{-10}$ to $10^{-11}$ | Passed |

*1Cross-sectional shape in cutting in a horizontal direction from the center of gravity of the inner surface of the sealing region to outside
*2The pressing force is a load on the whole surface of a wafer (diameter: 4 inches)
*3Nos. 15 and 16 correspond to conventional examples, where a core material is not provided From Table 1, it is apparent that in the conventional example, a sealing region having sufficient airtightness can be formed when the pressurizing force is 200 MPa (No. 16), but when the pressurizing force is reduced to 150 MPa, leakage occurs, so that sealing becomes insufficient (No. 15). This indicates that in the conventional example, the sealing material has a flat upper surface, and an area of 120 mm2 (width: 0.3 mm, pattern shape: 10 mm square, the number of sealing regions: 10), and therefore sealing can be performed when the pressure is 200 MPa (24 kN), but leakage occurs when the pressure is 150 MPa (12 kN).

On the other hand, in this embodiment, leakage did not occur when the pressurizing force was 150 MPa, and leakage did not occur even when the pressurizing force was 100 MPa (No. 5). This result shows that a sealing region having sufficient airtightness can be formed while the load is reduced. Thus, it has been confirmed that when stress is concentrated on the inside of the sealing material by the core material, the metal powder is plastically deformed and recrystallized preferentially to densify the sealing material, and therefore hermetic sealing is established under a lower load as compared to a conventional example in which the whole surface of a sealing material should be pressed. However, it may be necessary to control the particle size of a metal powder for forming the metal powder sintered body as a sealing material. When a metal powder paste with a large particle size is used as in No. 7, sealing is insufficient even when the core material is used.

INDUSTRIAL APPLICABILITY

The present invention solves the problem of an increase in pressing load which is feared in production of a hermetic sealing package with a plurality of sealing regions provided on a substrate. The present invention can afford reliable hermetic sealing while reducing a pressing load, allows a plurality of portions to be hermetically sealed in a relatively simple step, and can be expected to be applied to wafer-level packaging.

The invention claimed is:

1. A package production method, comprising the step of superposing a pair of substrates on each other, and bonding the substrates to each other to hermetically seal the inside of a sealing region surrounded by a sealing material, the sealing material being formed on at least one of the substrates, wherein
the sealing material is formed of a sintered body obtained by sintering a metal powder of at least one selected from gold, silver, palladium and platinum, the metal powder having a purity of 99.9% by weight or more and an average particle size of 0.005 μm to 1.0 μm,
at least one core material having a width smaller than the width of the sealing material in a cross-sectional shape, and protruding from the periphery is formed on the substrate,
the core material compresses the sealing material when the pair of substrates are bonded to each other,
A bulk-like metal film including any metal selected from gold, silver, palladium, platinum, titanium, chromium, copper, tungsten, nickel and an alloy of these metals is formed on a surface of the substrate, and
the bulk-like metal film including any metal selected from gold, silver, palladium, platinum, titanium, chromium, copper, tungsten, nickel and an alloy of these metals is formed on a top surface of the core material.

2. The package production method according to claim 1, wherein the sealing material is formed on one of the substrates, and the core material is formed on a substrate which is not provided with the sealing material.

3. The package production method according to claim 2, wherein a recess is formed in regions adjacent to the core material on both sides to form a cross-sectionally convex core material.

4. The package production method according to claim 2, wherein the ratio (W'/W) of the total width (W') of the core material and the width (W) of the sealing material on a cross-section of the sealing material is not less than 0.05 and not more than 0.95.

5. The package production method according to claim 2, wherein the metal film has a thickness of not less than 0.01 μm and not more than 5 μm.

6. The package production method according to claim 1, wherein the sealing material is formed on one of the substrates, the core material is formed on a substrate provided with the sealing material, and the sealing material covers at least a top surface portion of the core material.

7. The package production method according to claim 6, wherein a recess is formed in regions adjacent to the core material on both sides to form a cross-sectionally convex core material.

8. The package production method according to claim 6, wherein the ratio (W'/W) of the total width (W') of the core material and the width (W) of the sealing material on a cross-section of the sealing material is not less than 0.05 and not more than 0.95.

9. The package production method according to claim 6, wherein the metal film has a thickness of not less than 0.01 μm and not more than 5 μm.

10. The package production method according to claim 1, wherein the sealing material is formed on both the substrates, the core material is formed on at least one of the substrates provided with the sealing material, and the sealing material covers at least the top surface portion of the core material.

11. The package production method according to claim 10, wherein a recess is formed in regions adjacent to the core material on both sides to form a cross-sectionally convex core material.

12. The package production method according to claim 10, wherein the ratio (W'/W) of the total width (W') of the core material and the width (W) of the sealing material on a cross-section of the sealing material is not less than 0.05 and not more than 0.95.

13. The package production method according to claim 10, wherein the metal film has a thickness of not less than 0.01 μm and not more than 5 μm.

14. The package production method according to claim 1, wherein a recess is formed in regions adjacent to the core material on both sides to form a cross-sectionally convex core material.

15. The package production method according to claim 14, wherein the ratio (W'/W) of the total width (W') of the core material and the width (W) of the sealing material on a cross-section of the sealing material is not less than 0.05 and not more than 0.95.

16. The package production method according to claim 1, wherein the ratio (W'/W) of the total width (W') of the core material and the width (W) of the sealing material on a cross-section of the sealing material is not less than 0.05 and not more than 0.95.

17. The package production method according to claim 1, wherein the metal film has a thickness of not less than 0.01 μm and not more than 5 μm.

* * * * *